(12) United States Patent
Liu

(10) Patent No.: US 11,869,608 B2
(45) Date of Patent: Jan. 9, 2024

(54) ANTI-FUSE UNIT AND ANTI-FUSE ARRAY

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 169 days.

(21) Appl. No.: 17/384,945

(22) Filed: Jul. 26, 2021

(65) Prior Publication Data
US 2021/0350863 A1 Nov. 11, 2021

Related U.S. Application Data

(63) Continuation of application No. PCT/CN2021/080330, filed on Mar. 12, 2021.

(30) Foreign Application Priority Data

Apr. 8, 2020 (CN) .......................... 202010271766.9

(51) Int. Cl.
*G11C 17/16* (2006.01)
*H01L 23/525* (2006.01)

(52) U.S. Cl.
CPC .......... *G11C 17/16* (2013.01); *H01L 23/5252* (2013.01)

(58) Field of Classification Search
CPC .................................. H01L 23/5252
USPC ............................................................ 365/96
See application file for complete search history.

(56) References Cited

U.S. PATENT DOCUMENTS

| 4,876,220 A | 10/1989 | Mohsen |
| 9,496,270 B2 | 11/2016 | Nygaard |
| 9,929,090 B2 | 3/2018 | Chang et al. |
| 10,847,456 B2 | 11/2020 | Chang et al. |
| 2016/0019983 A1* | 1/2016 | Chung ............. G11C 29/78 365/96 |
| 2016/0351498 A1 | 12/2016 | Chang et al. |
| 2018/0218977 A1* | 8/2018 | Chang ............. G11C 17/16 |

FOREIGN PATENT DOCUMENTS

| CN | 106030793 A | 10/2016 |
| CN | 209785927 U | 12/2019 |
| JP | 2005203668 A | 7/2005 |

OTHER PUBLICATIONS

International Search Report in the international application No. PCT/CN2021/080330, dated May 28, 2021, 2 pgs.

* cited by examiner

*Primary Examiner* — Muna A Techane
(74) *Attorney, Agent, or Firm* — Cooper Legal Group, LLC

(57) ABSTRACT

An anti-fuse unit and an anti-fuse array. The anti-fuse unit includes an anti-fuse device and a diode. An anode of the anti-fuse device is electrically connected with a bit line, a cathode of the anti-fuse device is electrically connected with an anode of the diode, and a cathode of the diode is electrically connected with a word line.

14 Claims, 6 Drawing Sheets

ANTI-FUSE UNIT AND ANTI-FUSE ARRAY

CROSS-REFERENCE TO RELATED APPLICATION

This application is a continuation application of International Patent Application No. PCT/CN2021/080330, filed on Mar. 12, 2021 and entitled "Anti-fuse Unit Structure and Anti-fuse Array", which claims priority to Chinese Patent Application No. 202010271766.9, filed on Apr. 8, 2020 and entitled "Anti-fuse Unit Structure and Anti-fuse Array". The contents of International Patent Application No. PCT/CN2021/080330 and Chinese Patent Application No. 202010271766.9 are hereby incorporated by reference in their entireties.

TECHNICAL FIELD

The disclosure relates to an anti-fuse unit and an anti-fuse array.

BACKGROUND

A Dynamic Random Access Memory (DRAM) chip usually has redundant memory cells, and these redundant memory cells can replace defective memory cells when the DRAM chip has the defective memory cells to achieve the purpose of repairing the DRAM. When the DRAM chip is repaired, one-time program (OTP) devices, such as anti-fuse units, are used.

With the development of technologies, the dimension of a semiconductor has further decreased, and a gate oxide layer has become thinner and thinner. When the DRAM chip is repaired, a high programmed voltage is used to break down the gate oxide layer, so that an anti-fuse unit reaches a programmed state.

SUMMARY

According to a plurality of embodiments, a first aspect of the disclosure provides an anti-fuse unit, including an anti-fuse device and a diode;

an anode of the anti-fuse device is electrically connected with a bit line, a cathode of the anti-fuse device is electrically connected with an anode of the diode, and a cathode of the diode is electrically connected with a word line.

According to a plurality of embodiments, a second aspect of the disclosure provides an anti-fuse array, including a plurality of anti-fuse units as described above. The plurality of anti-fuse units form an array with M rows and N columns, Respective anodes of the anti-fuse devices of the M anti-fuse units in a same column are electrically connected with a same bit line; and respective cathodes of the diodes of the N anti-fuse units in a same row are electrically connected with a same word line.

Details of one or more embodiments of the present disclosure will be proposed in the following accompanying drawings and descriptions. Other features and advantages of the present disclosure will become apparent from the specification, the accompanying drawings and the claims.

BRIEF DESCRIPTION OF THE DRAWINGS

To describe the technical solutions in the embodiments of the present disclosure more clearly, the following briefly introduces the accompanying drawings required in the embodiments. Apparently, the accompanying drawings in the following description show only some embodiments of the present disclosure, and those of ordinary skill in the art may derive other drawings from these accompanying drawings without creative efforts.

Figure 1:
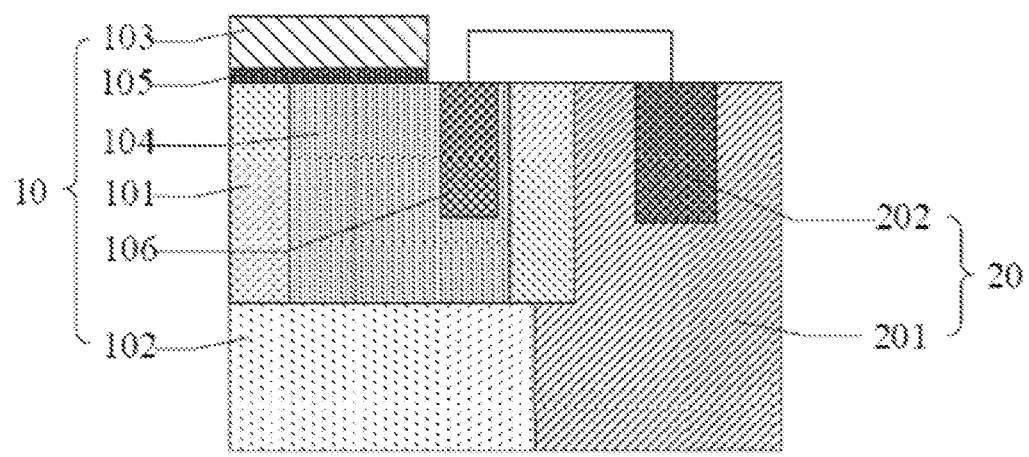
FIG. 1 is a schematic diagram of an anti-fuse unit according to an embodiment of the disclosure.

List of Reference Numerals: 10: anti-fuse device; 101: shallow trench isolation region; 102: well region of first conductive type; 103: gate layer; 104: anti-fuse injection layer; 105: gate oxide layer; 106: heavily doped region of second conductive type; 20: diode; 201: well region of second conductive type; 202: doped region of first conductive type; 30: switch.

DETAILED DESCRIPTION

An existing anti-fuse unit includes an anti-fuse device and a selection transistor. A programming voltage is a high voltage, so that the selection transistor may be damaged during breakdown of the anti-fuse device. In order to guarantee the reliability of the selection transistor, compared with the anti-fuse device, the selection transistor usually uses a thicker gate oxide layer and has a larger dimension.

In order to facilitate an understanding of the disclosure, the disclosure will be described more comprehensively below with reference to related accompanying drawings. Preferred embodiments of the disclosure are illustrated in the drawings. However, the disclosure can be embodied in many different forms, and is not limited to the embodiments described herein. Rather, these embodiments are provided so that the disclosed content of the disclosure will be more thorough and complete.

Unless otherwise defined, all technical and scientific terms used herein are the same as meanings of general understandings of those skilled in the art of the disclosure. The terms used in the description of the disclosure herein are merely to describe the specific embodiments, not intended to limit the disclosure. The term "and/or" used herein includes any and all combinations of one or more related listed items.

In the description of the disclosure, it should be noted that the orientations or positional relationships indicated by terms "upper", "lower", "vertical", "horizontal", "inside", "outside" and the like are orientations or positional relationships as shown in the drawings, and are only for the purpose of facilitating and simplifying the description of the disclosure instead of indicating or implying that devices or elements indicated must have particular orientations, and be constructed and operated in the particular orientations, so that these terms are not construed as limiting the disclosure.

Figure 2:
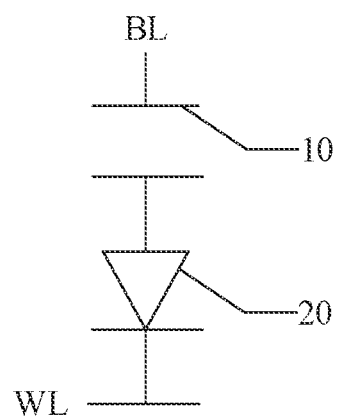
FIG. 2 is a circuit diagram of an anti-fuse unit according to another embodiment of the disclosure.

As shown in FIG. 2, the disclosure provides an anti-fuse unit, including an anti-fuse device 10 and a diode 20. The anode of the anti-fuse device 10 is electrically connected with a bit line, the cathode of the anti-fuse device 10 is electrically connected with the anode of the diode 20, and the cathode of the diode 20 is electrically connected with a word line.

In an optional embodiment, a substrate is provided. The substrate may be a semiconductor substrate, such as a monocrystalline silicon substrate, a monocrystalline germanium substrate and the like.

As shown in FIG. 1, in an optional embodiment, the anti-fuse device 10 is formed on the substrate. The substrate also includes a shallow trench isolation region 101 inside the substrate. A material of the shallow trench isolation region 101 may be an oxide, such as silicon dioxide. A well region of a first conductive type 102 is formed in the substrate, so that the well region of the first conductive type 102 is located inside the substrate. The first conductive type may be a P type. Of course, in other examples, the first conductive type may be an N type.

In an optional embodiment, the anti-fuse device 10 includes a gate layer 103, an anti-fuse injection layer 104, and a gate oxide layer 105. The gate oxide layer 105 is located on an upper surface of the substrate. The gate oxide layer 105 covers a portion of the shallow trench isolation region 101 and a portion of the well region of the first conductive type 102. A material of the gate oxide layer 105 may be one or a combination of high-K dielectric materials such as silicon oxide, silicon nitride, silicon oxynitride, zirconium oxide, and hafnium oxide. However, the material of the gate oxide layer 105 in an actual embodiment is not limited to this.

In an optional embodiment, the gate layer 103 is formed on an upper surface of the gate oxide layer 105, i.e., the gate layer 103 is the anode of the anti-fuse device 10. A material of the gate layer 103 may be at least one of polycrystalline silicon, titanium, tungsten, a metal silicide or other conductive materials. However, the material of the gate layer 103 cannot be limited to this in an actual embodiment.

Specifically, firstly, a gate oxide material layer may be formed on the surface of the substrate by using a thermal oxidation process or a deposition process. Secondly, a gate material layer is formed on the surface of the gate oxide material layer. Thirdly, a mask layer is formed on the surface of the gate material layer, and the mask layer is patterned so that the patterned mask layer defines the shapes and positions of the gate layer 103 and the gate oxide layer 105. Finally, the gate material layer and the gate oxide material layer are etched based on the patterned mask layer to form the gate layer 103 and the gate oxide layer 105.

The anti-fuse injection layer 104 is located in the well region of the first conductive type 102, i.e., the anti-fuse injection layer 104 is the cathode of the anti-fuse device 10. The gate oxide layer 105 is located between the gate layer 103 and the anti-fuse injection layer 104. The doping type of the anti-fuse injection layer 104 is contrary to the doping type of the well region of the first conductive type 102 and may be N-type doping that is formed by means of ion injection.

In an optional embodiment, the anti-fuse device 10 further includes a heavily doped region of a second conductive type 106. The heavily doped region of the second conductive type 106 is formed in the anti-fuse injection layer 104, and the heavily doped region of the second conductive type 106 is located between the gate layer 103 and the diode 20. The doping type of the heavily doped region of the second conductive type 106 is the same as the doping type of the anti-fuse injection layer 104. When the first conductive type is the P type, the second conductive type may be the N type. Of course, in other examples, when the first conductive type is the N type, the second conductive type may be the P type.

In an optional embodiment, the diode 20 includes a well region of a second conductive type 201 and a doped region of a first conductive type 202. The well region of the second conductive type 201 is used as the cathode of the diode 20, and the doped region of the first conductive type 202 is used as the anode of the diode 20. The well region of the second conductive type 201 is located in the substrate, and the shallow trench isolation region 101 isolates the well region of the second conductive type 201 from the anti-fuse injection layer 104. The doping type of the well region of the second conductive type 201 are different from the doping type of the well region of the first conductive type 102, and may be N-type doping that is formed by means of ion injection. The doped region of the first conductive type 202 is located inside the well region of the second conductive type 201. The doping type of the doped region of the first conductive type 202 and the doping type of the well region of the second conductive type 201 are different from each other, and the doped region of the first conductive type 202 may be P-type heavily doped regions.

The diode 20 is used to replace the selection transistor, so that it is unnecessary to consider the influence of the thickness of the gate oxide layer of the selection transistor and the dimension of the selection transistor on the device reliability during programming with high voltage. The use of the diode 20 enables the structure of the anti-fuse unit to become simpler, the reliability is improved, and the dimension can be smaller.

Figure 3:
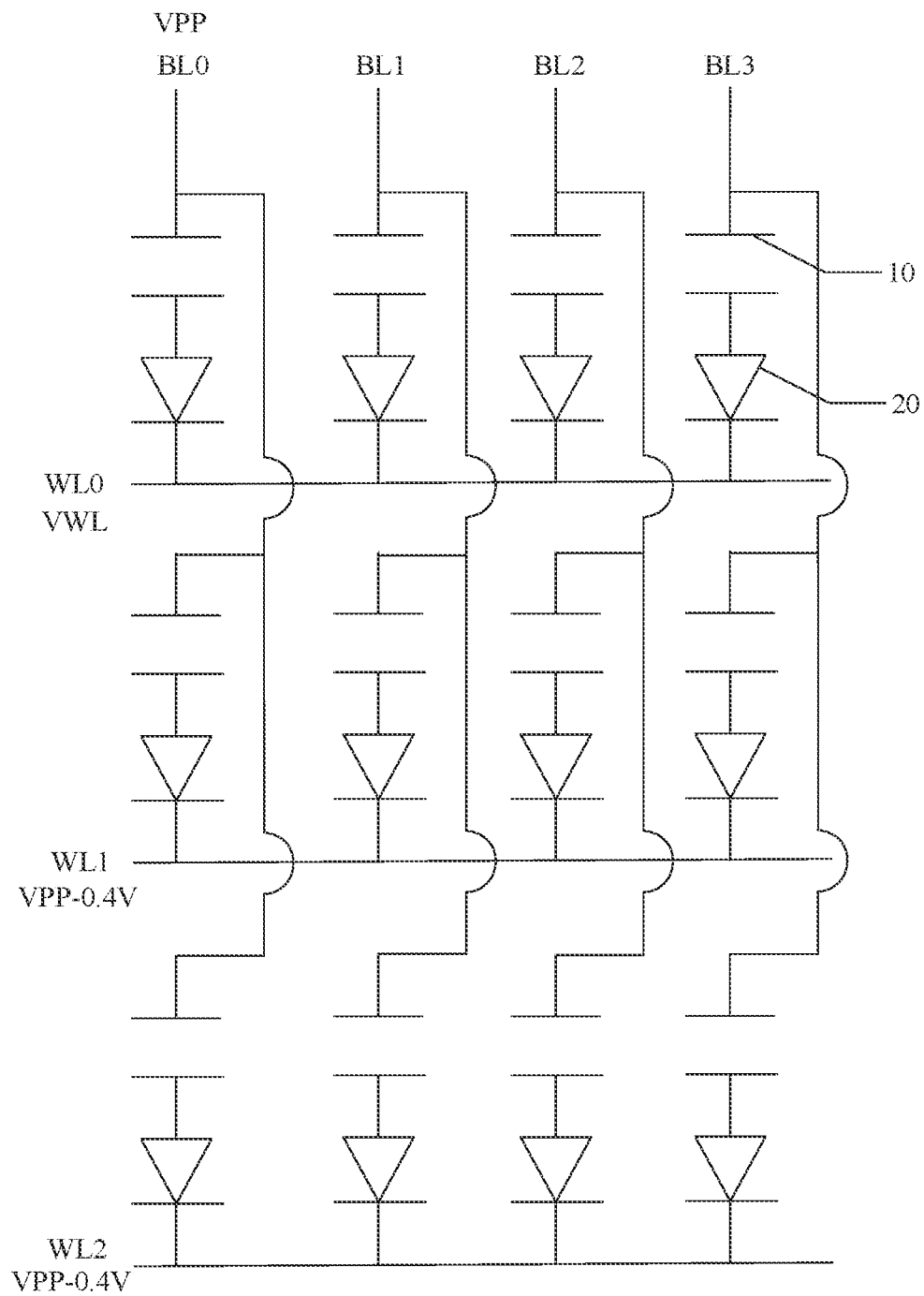
FIG. 3 is a circuit diagram illustrating a programmed state of an anti-fuse array according to an embodiment of the disclosure.

As shown in FIG. 3, the disclosure further provides an anti-fuse array, including a plurality of anti-fuse units in any of the above-mentioned embodiments. The plurality of anti-fuse units form an array with M rows and N columns. The respective anodes of the anti-fuse devices 10 of the M anti-fuse units in the same column are electrically connected with the same bit line, and the respective cathodes of the N anti-fuse devices 10 in the same row are electrically connected with the same word line. For example, when the bit line connected with the anti-fuse devices 10 in the column where BL0 is located is connected with a programming voltage VPP, if a voltage difference between the voltage VWL of the word line connected with the anti-fuse units in the row where WL0 is located and the programming voltage VPP can break down the anti-fuse devices 10, the anti-fuse unit at column BL0 and row WL0 is in a programmed state, and the programming voltage VPP may be 6 V. At this time, the voltage VWL of the word line connected with the anti-fuse unit in the programmed state may be 0 V, and the voltages VWL of the word lines connected with the anti-fuse units in other rows may be VPP-0.4 V, so that a voltage difference between a voltage of the bit line and a voltage of the word line is less than a turn-on voltage of the diode 20. At this time, only the anti-fuse unit at column BL0 and row WL0 can be programmed.

Figure 4:
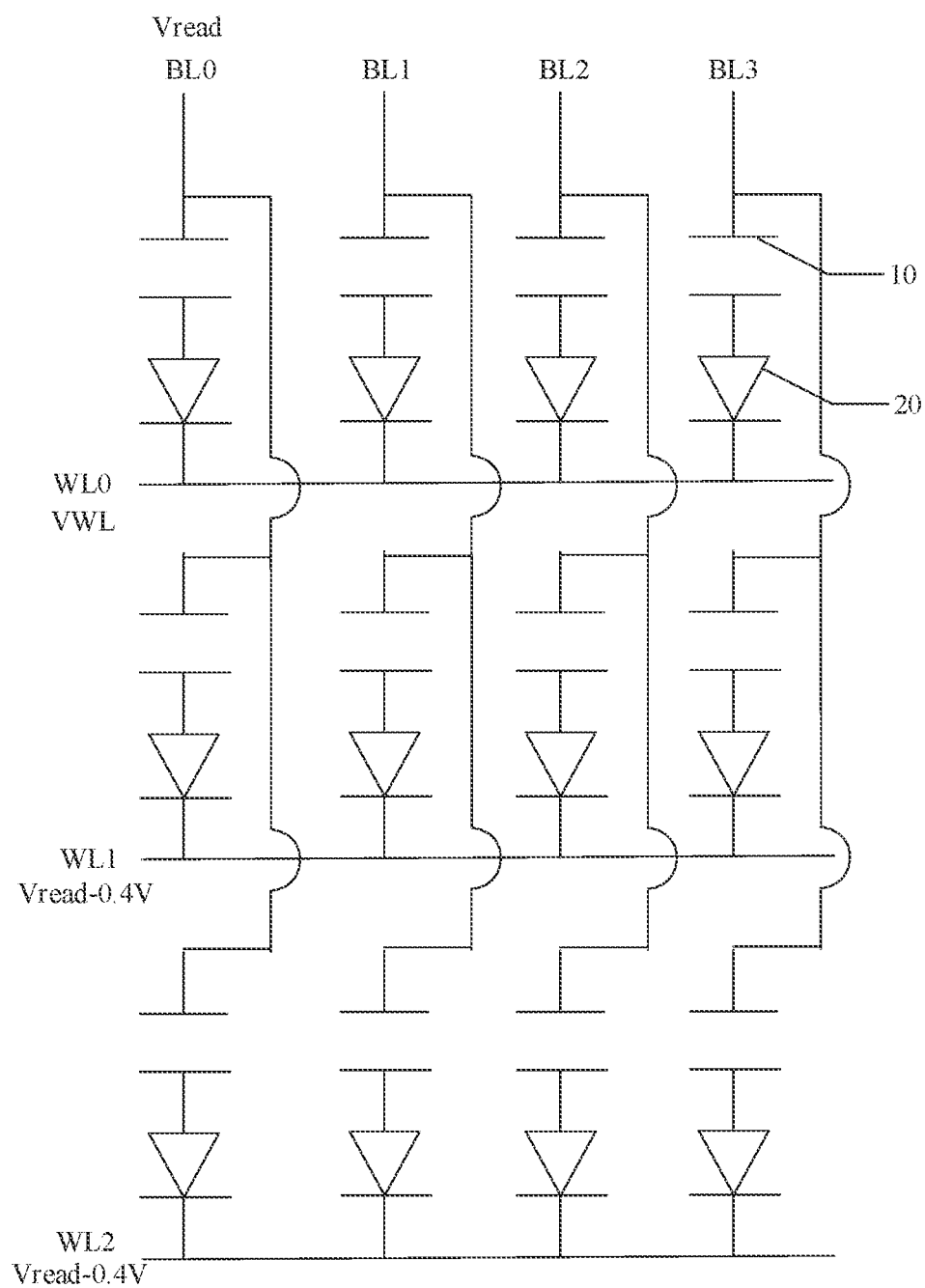
FIG. 4 is a circuit diagram illustrating a read state of an anti-fuse array according to another embodiment of the disclosure.

As shown in FIG. 4, similarly, when the anti-fuse unit at column BL0 and row WL0 needs to be read, the bit line connected with the anti-fuse devices 10 at the column where BL0 is located is controlled to be connected with a reading voltage Vread, and the voltage VWL of the word line connected with the anti-fuse devices 10 in the row where WL0 is located is set to be 0 V, so that the anti-fuse unit at column BL0 and row WL0 is in a read state. The read voltage Vread may be 1 V, and the voltages VWL of the word lines connected with the anti-fuse units in other rows may be Vread-0.4 V, so that a voltage difference between a voltage of the bit line and a voltage the word line is less than the turn-on voltage of the diode 20. At this time, only the anti-fuse unit at column BL0 and row WL0 can be read.

In an optional embodiment, N and M are positive integers. In another optional embodiment, N and M are positive even numbers.

Figure 5:
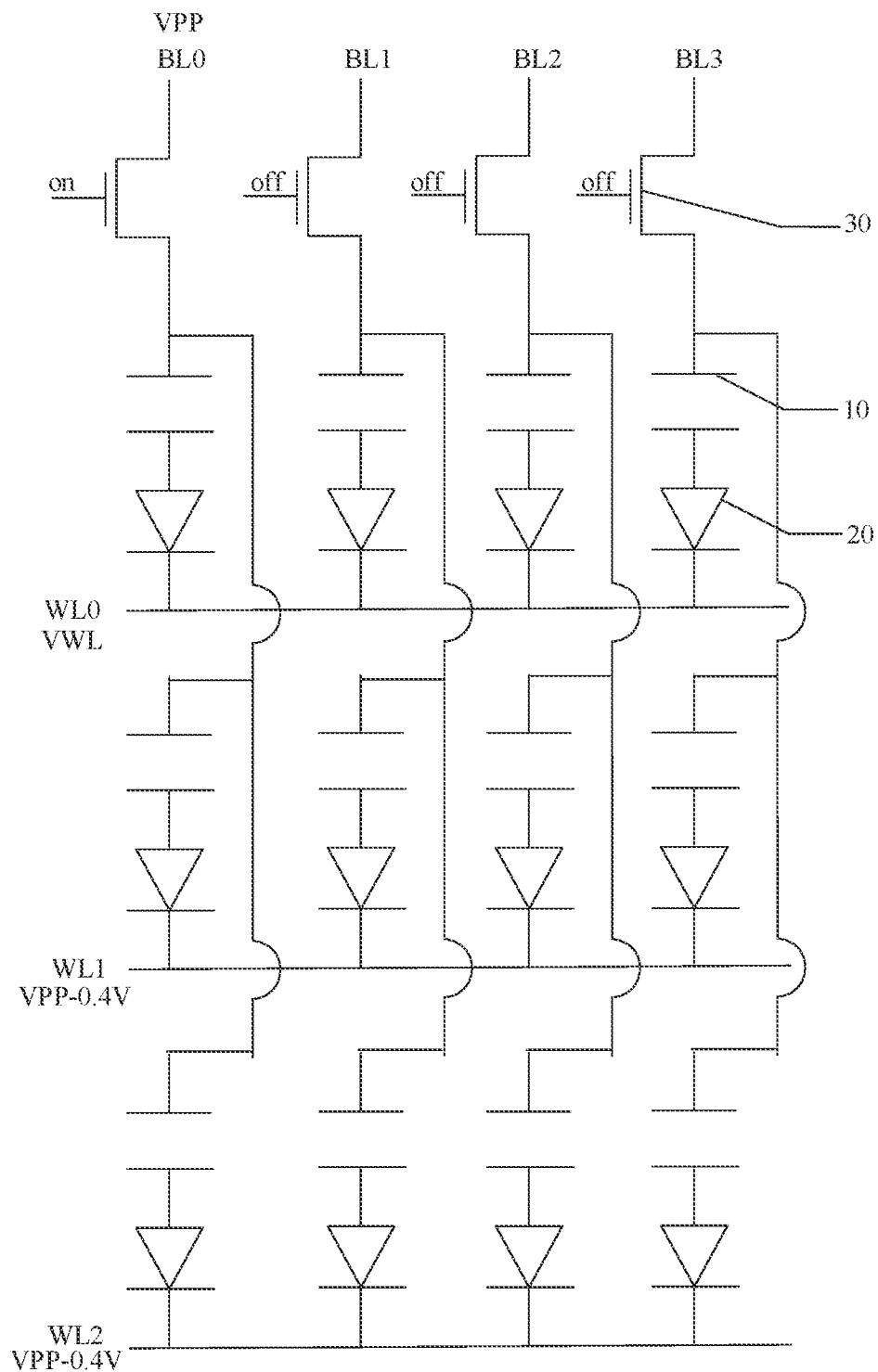
FIG. 5 is a circuit diagram illustrating a programmed state of an anti-fuse array according to an embodiment of the disclosure.
Figure 6:
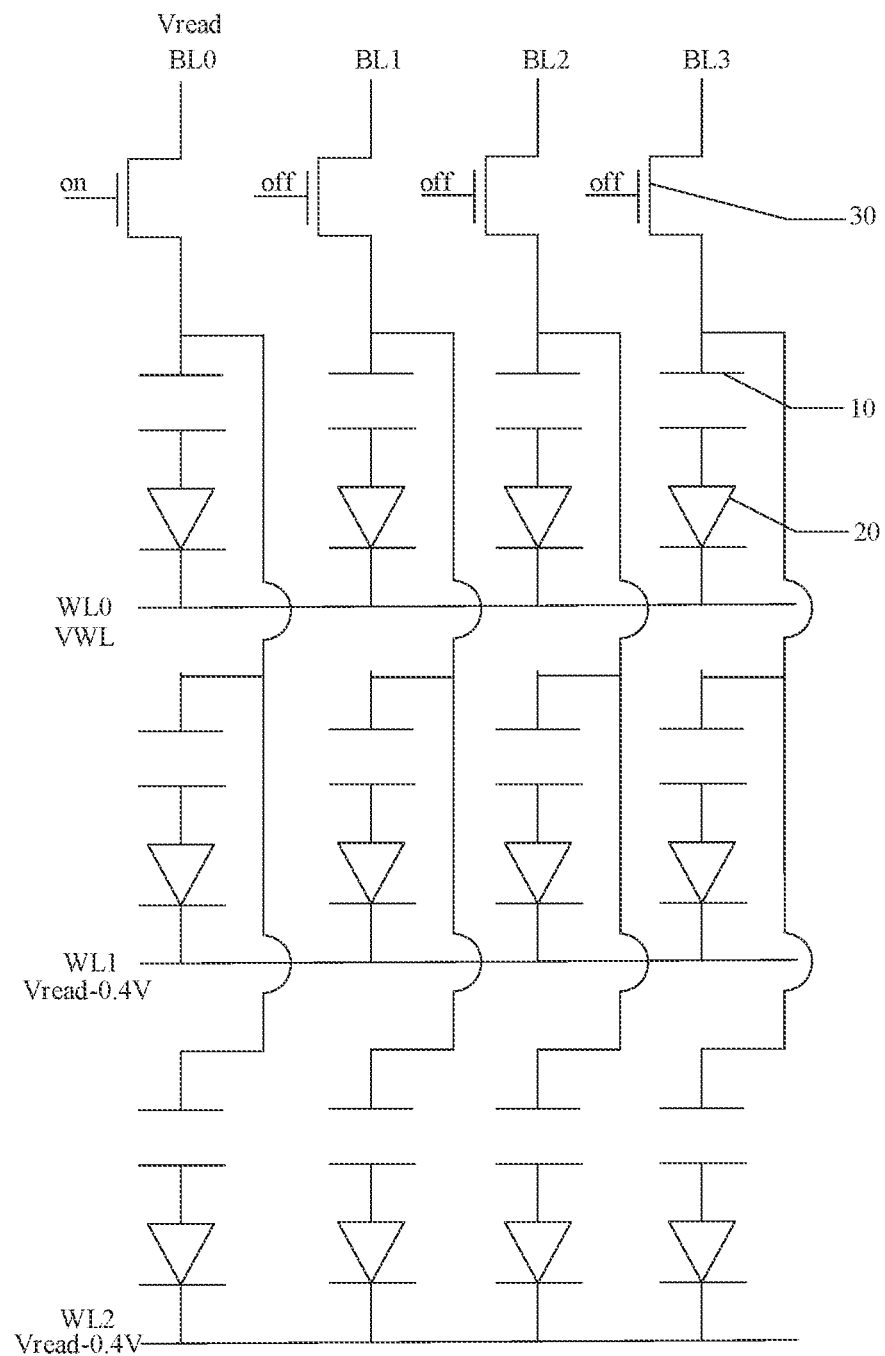
FIG. 6 is a circuit diagram illustrating a read state of an anti-fuse array including a switch according to an embodiment of the disclosure.

As shown in FIG. 5 and FIG. 6, in an optional embodiment, each of the bit lines in the same column is also connected in series with a switch 30 configured to control a connection or a disconnection of the anti-fuse devices 10 in the respective column where the switch 30 is located. The switch 30 may be an N-channel Metal Oxide Semiconductor (NMOS) tube. The drain electrode of the NMOS tube is connected with the bit line voltage, the source electrode of the NMOS tube is electrically connected with the anodes of the anti-fuse devices 10; the gate of the NMOS tube is connected with a control voltage to control turn off and turn on of the NMOS tube.

By means of the above-mentioned anti-fuse array, working staff can effectively control programming and reading of the anti-fuse units in the array, and compact arrangement can also further minimize the anti-fuse array.

The technical features of the embodiments described above can be arbitrarily combined. In order to make the description concise, all possible combinations of various technical features in the above embodiments are not completely described. However, the combinations of these technical features should be considered as the scope described in the present specification as long as there is no contradiction in them.

The foregoing embodiments represent only a few implementation modes of the disclosure, and the descriptions are specific and detailed, but should not be construed as limiting the patent scope of the disclosure. It should be noted that those of ordinary skill in the art can further make various transformations and improvements without departing from the concept of the disclosure, and these transformations and improvements all fall within the protection scope of the disclosure. Therefore, the protection scope of the patent of the disclosure shall be subject to the appended claims.

The invention claimed is:

1. An anti-fuse circuit, comprising an anti-fuse device and a diode,
    wherein an anode of the anti-fuse device is electrically connected with a bit line, a cathode of the anti-fuse device is electrically connected with an anode of the diode, and a cathode of the diode is electrically connected with a word line,
    wherein the anti-fuse device comprises:
        a gate layer located on a substrate, the gate layer being the anode of the anti-fuse device;
        an anti-fuse injection layer located in the substrate, the anti-fuse injection layer being the cathode of the anti-fuse device; and
        a gate oxide layer located between the gate layer and the anti-fuse injection layer.

2. The anti-fuse circuit of claim 1, wherein the anti-fuse device further comprises a shallow trench isolation region and a well region of a first conductive type, the gate oxide layer covers a portion of the shallow trench isolation region, the anti-fuse device is located in the well region of the first conductive type, and the well region of the first conductive type is located in the substrate.

3. The anti-fuse circuit of claim 2, wherein the anti-fuse device further comprises a heavily doped region of a second conductive type, and the heavily doped region of the second conductive type is located in the anti-fuse injection layer.

4. The anti-fuse circuit of claim 1, wherein the diode comprises:
    a well region of a second conductive type located in the substrate, the well region of the second conductive type being the cathode of the diode; and
    a doped region of a first conductive type located in the well region of the second conductive type, the doped region of the first conductive type being the anode of the diode.

5. The anti-fuse circuit of claim 3, wherein the first conductive type is a P type, and the second conductive type is an N type.

6. The anti-fuse circuit of claim 1, wherein a material of the gate oxide layer is one or a combination of silicon oxide, silicon nitride, silicon oxynitride, zirconium oxide, and hafnium oxide.

7. The anti-fuse circuit of claim 1, wherein a material of the gate layer is at least one of polycrystalline silicon, titanium, tungsten, or metal silicide.

8. The anti-fuse circuit of claim 4, wherein the first conductive type is a P type, and the second conductive type is an N type.

9. An anti-fuse array, comprising a plurality of anti-fuse circuits, wherein each of the plurality of anti-fuse circuits is the anti-fuse circuit according to claim 1,
    wherein the plurality of anti-fuse circuits form an array with M rows and N columns, respective anodes of the anti-fuse devices of the M anti-fuse circuits in a same column are electrically connected with a same bit line, and respective cathodes of the diodes of the N anti-fuse circuits in a same row are electrically connected with a same word line.

10. The anti-fuse array of claim 9, wherein each of the bit lines in the same column is connected in series with a switch configured to control a connection or a disconnection of a respective one of the bit lines in the same column.

11. The anti-fuse array of claim 10, wherein M and N are positive even numbers.

12. The anti-fuse array of claim 11, wherein a difference between a voltage of the bit line and a voltage of the word line is less than a turn-on voltage of the diode.

13. An anti-fuse circuit, comprising an anti-fuse device and a diode,
    wherein an anode of the anti-fuse device is electrically connected with a bit line, a cathode of the anti-fuse device is electrically connected with an anode of the diode, and a cathode of the diode is electrically connected with a word line,
    wherein the diode comprises:
        a well region of a second conductive type located in a substrate, the well region of the second conductive type being the cathode of the diode; and
        a doped region of a first conductive type located in the well region of the second conductive type, the doped region of the first conductive type being the anode of the diode.

14. The anti-fuse circuit of claim 13, wherein the first conductive type is a P type, and the second conductive type is an N type.

* * * * *